Figure 1:
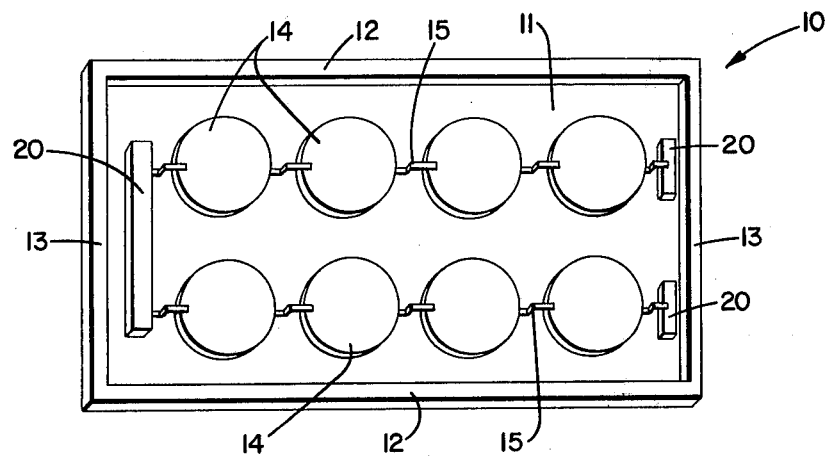

United States Patent [19]

Lindmayer

[11] 4,057,439
[45] Nov. 8, 1977

[54] SOLAR PANEL

[75] Inventor: Joseph Lindmayer, Bethesda, Md.

[73] Assignee: Solarex Corporation, Rockville, Md.

[21] Appl. No.: 715,407

[22] Filed: Aug. 25, 1976

[51] Int. Cl.² .............................................. H01L 31/04
[52] U.S. Cl. ................................ 136/89 P; 136/89 H
[58] Field of Search ............... 136/89 P, 89 CC, 89 H

[56] References Cited

U.S. PATENT DOCUMENTS

| 3,620,847 | 11/1971 | Wise | 136/89 |
|---|---|---|---|
| 3,658,596 | 4/1972 | Osborne | 136/89 |
| 3,957,537 | 5/1976 | Baskett et al. | 136/89 |
| 3,982,963 | 9/1976 | Mahoney et al. | 136/89 |

Primary Examiner—John H. Mack
Assistant Examiner—Aaron Weisstuch
Attorney, Agent, or Firm—Walter D. Ames

[57] ABSTRACT

A solar panel having solar cells adhered to the base surface thereof by a single component, room temperature vulcanizing silicone resin and encapsulated in a multicomponent silicone resin with desirable optical properties.

8 Claims, 2 Drawing Figures

U.S. Patent  Nov. 8, 1977  4,057,439

SOLAR PANEL

Solar energy cells, known also as photovoltaic cells, are wafer-like devices that convert light into electricity. As a practical matter, at the present time the size of the wafer that constitutes the photovoltaic cell, which may advantageously be formed from silicon, is generally 2¼ or 3 inches in diameter, circular cells being quite common in commercial use. As each individual cell generates a voltage, for example, of about 0.4 to 0.6 volts, that is ordinarily insufficient to generate the proper current desired for a particular job. Thus solar cells, connected in series or in parallel, are mounted on a frame in a more or less permanent way so that the resulting unitary structure, which may be referred to as a solar panel, can be transported and erected, thereby transporting and erecting a plurality of individual solar cells.

The present invention is directed generally to a mounting structure including solar energy cells and a method of making it. It is particularly directed to a solar panel in which a plurality of cells are mounted on a relatively flat surface so that at least one surface of the cells is in position to be free of interfering structure and to be directly exposed to sunlight or another source of radiated energy.

The manufacture of solar panels is often accomplished at the present time by soldering or otherwise joining individual solar cells to form a strip or series of individual cells, which are mounted in a tray having a substantially flat mounting surface. The cells are adhered to the tray and are surrounded or encapsulated within a transparent material in such a manner that light entering the solar panel will pass substantially unobstructed through the transparent encapsulant for the cells and will impinge upon exposed surfaces of the individual solar energy cells. Typically, a solar panel is formed from at least one solar energy cell in the form of a thin, 3 inch diameter wafer that has one of its two planar surfaces adhered to the flat base of the tray that comprises the base element of the solar panel, with the other planar surface of the cell directed toward the open top of the tray and in position to receive light impinging there upon. The transparent material is usually selected from those that will not only provide minimal obstruction to the passage of light through the encapsulating material to the exposed planar surface of the cell, but which will also have optimal weathering characteristics to protect the encapsulated cells from ambient conditions.

Ideally, a solar panel that houses a plurality of silicon solar energy cells will have a life expectancy of at least ten and, more advantageously, twenty years. Consequently, the materials from which the panels are formed will be selected not only so that they will protect the encapsulated cells over the anticipated life span but so that the cells within the panels will operate with proper integrity over the anticipated life time. If one of the basic components of the solar panel fails, the life of the panel can be substantially decreased regardless of the fact that the silicon solar energy cells that are a part of the panel have not been damaged and are capable of continued, optimal functioning. In particular, a problem that has been encountered relates to the resinous material that is generally utilized to form at least the base member of the tray in which the solar cells are mounted. It has in the past been known that an epoxy type material often called epoxy fiberglass, can form an excellent and long-lasting base member to one planar surface of which the solar cells may be adhered. The remainder of the panel is composed of a frame with a top opposite the flat base open for the entrance of light. After the solar cells have been mounted on the epoxy base of the tray, the remainder of the space bounded by the frame and base is filled with a silicone rubber of a type that is known to have an extended life expectancy under varying ambient conditions. Both epoxy resin and silicone rubber are known to have desirable life expectancies.

A substantial problem that has arisen in constructing such trays, however, has been to maintain proper adherence of the silicone rubber to the other materials from which the tray is constructed. Manufacturers of silicone rubber, therefore, prescribe that a primer should be used between the silicone rubber and the material to be coated with that rubber in order to obtain desired adherence of the rubber. For example, Dow Corning, in Bulletin No. 61-283, dated September 1974, states that its silicone materials identified by trademarks SYLGARD 182, 183, 184, and 185, will not normally bond to clean, nonporous surfaces such as metal or glass. To ensure adhesion to these surfaces, says Dow Corning, a primer is necessary. The primer, according to the manufacturer, should be applied in a very thin coat to the surface to which adhesion is desired, then air dried or, for better adhesion, the primer should be heat cured for 1 hour at 70° C. The encapsulating silicone resin, itself, is normally a two-part material, e.g., Dow Corning Sylgard 182. Sylgard 182 is a combination of ten parts of silicone resin to one part of curing agent.

In accelerated life tests, however, erratic results were obtained in adhering multipart, i.e., resin plus curing agent, silicone resins to a planar epoxy or metal surface even when a prescribed primer was utilized. The result of such deficiencies was most notable in delamination: the silicone rubber separated from the resinous or metal base member of the tray.

There are other disadvantages in utilizing a primer in accordance with the instructions of the manufacturer. Thus, the manufacturer says that better adhesion results from heat curing of the primer for 1 hour at 70° C. In any production line operation the necessity to heat cure for one hour can result in a serious economic disadvantage. Normal production line operation would dictate that the time between the coating of the primer on the resin board and the time when the strip of cells is to be applied to the board, then encapsulated, be as short as possible. Nevertheless, in a substantial number of cases, even when the instructions of the manufacturer are followed precisely, delamination occurred after the solar panels were exposed to ambient conditions, especially to rays of the sun in the presence of moisture and heat. Delamination is known to occur in periods between three days and six months.

It is, therefore, the primary object of the present invention to provide a method of assembling a solar energy cell panel in which improved adherence of the solar cells to a base or support member of the panel is obtained. This result is accomplished by the expedient of utilizing a one-part silicone resin in lieu of the primer prescribed by the manufacturer, then applying the mixture of silicone resin and curing agent, and encapsulating the silicon solar energy cells adhered to the base member by the one-part, room temperature vulcanizing adhesive. While the one-part, room temperature vulcanizing silicone resin has superior adhesive qualities that enable it to be used in lieu of a primer for the two-part resin previously referred to, it has optical properties that make it undesirable for use as the encapsulating material itself. In addition, it is not possible to utilize single component silicone rubber as the encapsulant for solar cells in a solar panel because the single component silicone tends to set up at its surfaces and to cure last at its center, which remains fluid. Ultraviolet curing is not advantageous because solar panels are to be exposed to sunlight and the ultraviolet rays will continue to cause a curing reaction in the single component silicone resin.

Figure 2:
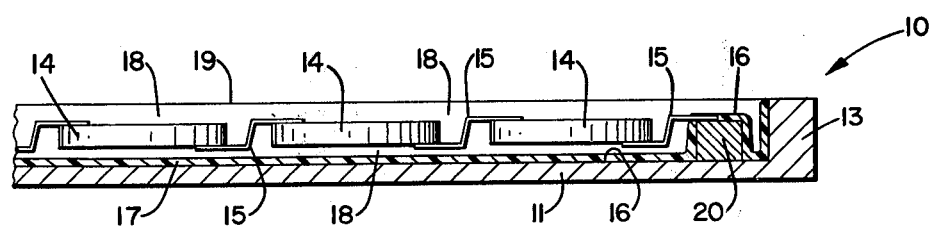

The present invention will be more apparent by reference to the illustration of a preferred embodiment thereof in the accompanying drawing, in which FIG. 1 is a top view, in perspective, and FIG. 2 is an enlarged, fragmentary side elevational view of the panel, with portions broken away.

As the preferred embodiment of my invention, a frame or tray was formed from an epoxy fiberglass resin, although metals, such as steel, aluminum, copper and titanium, have proved useful. The frame, which is illustrated in FIGS. 1 and 2 of the accompanying drawing and is generally referred to be the reference numeral 10, had a base member 11, side pieces 12 and end members 13, all integral with each other. Mounted in the tray were a series of silicon solar energy cells 14 electrically connected to each other by contact strips 15. Electricity generated by the cells was conducted to bussbars 20.

As best seen in FIG. 2 of the drawing, the epoxy fiberglass base member 11 of the panel has a front surface 16 that is substantially planar. To this surface a coating of single component RTV silicone rubber adhesive/sealant, a resin manufactured by General Electric Co., Waterford, N.Y., was applied in a continous layer. That layer, indicated by reference numeral 17, is applied by known means such as brushing, spraying or rolling in a thin layer relative to the thickness of the layer of multipart silicone resin to be later applied. It has been found that the layer, while most practically applied in a range of about 1 to 10 mils, and most generally about 2 mils in thickness, could be less than a mil thick and still be operative. Indeed, the thinner the layer the more rapid the curing and the more uniform the curing throughout the thickness of the layer.

After the room temperature vulcanizing adhesive had been applied in a layer about 2 mils thick, the so-coated base member and tray were permitted to cure at room temperature for about 10 to 100 minutes, more preferably 45 minutes, sometimes followed by outbake at 150° C for about 30 minutes. Then, the multipart silicone resin, which in this instance, was Sylgard 182 manufactured by Dow Corning Corp., Midland, Mich., an elastomeric silicone resin with ten percent curing agent, was applied to a depth of about 2 mm, over the layer of RTV resin. The strip of connected solar cells was laid in place, and additional multipart encapsulating silicone resin was added until the desired level within the tray 10 was reached. As indicated in the drawings, the multipart silicone resin in which the solar cells 14 are encapsulated is generally indicated by reference numeral 18. The surface of the layer of silicone resin 18 is indicated by reference numeral 19. Thereafter, the instructions of the manufacturer of multipart silicone resin may be followed with respect to curing, e.g., curing can be carried out for four hours at 65° C.

As so produced, the solar panel has the multipart silicone resin with desired optical properties firmly adhered to the base member of the tray through the intermediation of an RTV silicone resin that itself would prove highly undesirable for use as an encapsulating and light transmitting medium for the silicon solar energy cells. The result is a solar panel that resists delamination to a greater exent than that formed using a primer as prescribed by the manufacturer of the encapsulating resin.

It will be apparent that certain alterations and modifications will be recognized by those skilled in this art with respect to the structure of a solar panel and the method of forming that panel as disclosed in the foregoing description of my invention. As to all such obvious changes, I desire that they be included within the scope of the present invention, which is to be limited only by the purview including equivalents of the following, appended claims.

I claim:

1. A solar panel for maintaining solar energy cells in position to receive light impinging thereon, comprising a tray within which said cells are mounted, said tray including side and end members and a base member having a substantially planar surface within the space bounded by said tray, a layer of cured, single component silicone resin adhesively adhered to said planar surface, a layer of cured, multi-component silicone resin adhered to said single component layer, said single component layer being thinner than said multi-component layer, and photovoltaic cells disposed within and encapsulated by said multi-component layer so that said cells are maintained by said panel in position to receive light impinging on surfaces thereof and convert such light into electrical energy while being protected from ambient conditions and delamination by said encapsulant.

2. A solar panel as claimed in claim 1, in which the surface of said base member is formed from an epoxy fiberglass resin.

3. A solar panel as claimed in claim 1, in which the surface of said base member is formed from aluminum.

4. A solar panel as claimed in claim 1, in which said single component silicone resin possesses poorer optical properties than said multicomponent resin for permitting the passage of light therethrough.

5. A solar panel as claimed in claim 1, in which said single component silicone resin is room temperature vulcanizing.

6. A solar panel as claimed in claim 4, in which said single component silicone resin is room temperature vulcanizing.

7. A solar panel as claimed in claim 1, in which said layer of single component resin is about 1 to 10 mils thick.

8. A solar panel as claimed in claim 1, in which said layer of single component resin is about 2 mils thick.

* * * * *